US009029213B2

(12) United States Patent
Chang et al.

(10) Patent No.: US 9,029,213 B2
(45) Date of Patent: May 12, 2015

(54) STRINGER-FREE GATE ELECTRODE FOR A SUSPENDED SEMICONDUCTOR FIN

(71) Applicant: International Business Machines Corporation, Armonk, NY (US)

(72) Inventors: Josephine B. Chang, Mahopac, NY (US); Isaac Lauer, Yorktown Heights, NY (US); Chung-Hsun Lin, White Plains, NY (US); Jeffrey N. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 13/891,873

(22) Filed: May 10, 2013

(65) Prior Publication Data

US 2014/0332892 A1    Nov. 13, 2014

(51) Int. Cl.
*H01L 21/77* (2006.01)
*H01L 29/78* (2006.01)
*H01L 29/66* (2006.01)
*H01L 29/775* (2006.01)

(52) U.S. Cl.
CPC ........ *H01L 29/785* (2013.01); *H01L 29/66795* (2013.01); *H01L 29/66439* (2013.01); *H01L 29/775* (2013.01)

(58) Field of Classification Search
CPC ................... H01L 27/10826; H01L 27/10879; H01L 27/1087; H01L 27/12; H01L 27/1203; H01L 21/76224; H01L 21/76205; H01L 21/823821; H01L 21/823431; H01L 29/78603; H01L 21/823842; H01L 21/823437; H01L 21/7624; H01L 2224/32145; H01L 29/42392; H01L 27/0886; H01L 27/10876; H01L 27/0924; H01L 21/28273; H01L 29/41791; H01L 29/785; H01L 21/845; H01L 27/1211; H01L 21/823462; H01L 29/66818; H01L 21/82345; H01L 29/4236; H01L 29/78645; H01L 29/4958; H01L 2029/7858; H01L 29/7831; H01L 21/28008; H01L 21/76202
USPC .......... 257/365; 438/157, 211, 221, 283, 424, 438/425
See application file for complete search history.

(56) References Cited

U.S. PATENT DOCUMENTS

| 7,884,004 | B2 | 2/2011 | Bangsaruntip et al. |
| 8,211,729 | B2 | 7/2012 | Dupre et al. |
| 2007/0241414 | A1* | 10/2007 | Narihiro ........................ 257/401 |
| 2007/0298551 | A1 | 12/2007 | Bouvet et al. |
| 2009/0146194 | A1 | 6/2009 | Moselund et al. |

(Continued)

*Primary Examiner* — Marc Armand
*Assistant Examiner* — Sarah Salerno
(74) *Attorney, Agent, or Firm* — Scully, Scott, Murphy & Presser, P.C.; Louis J. Percello, Esq.

(57) ABSTRACT

At least one semiconductor fin is formed over an insulator layer. Portions of the insulator layer are etched from underneath the at least one semiconductor fin. The amount of the etched portions of the insulator is selected such that a metallic gate electrode layer fills the entire gap between the recessed surfaces of the insulator layer and the bottom surface(s) of the at least one semiconductor fin. An interface between the metallic gate electrode layer and a semiconductor gate electrode layer contiguously extends over the at least one semiconductor fin and does not underlie any of the at least one semiconductor fin. During patterning of a gate electrode, removal of the semiconductor material in the semiconductor gate electrode layer can be facilitated because the semiconductor gate electrode layer is not present under the at least one semiconductor fin.

16 Claims, 15 Drawing Sheets

(56) References Cited

U.S. PATENT DOCUMENTS

| | | |
|---|---|---|
| 2011/0133169 A1* | 6/2011 | Bangsaruntip et al. ......... 257/38 |
| 2011/0207335 A1 | 8/2011 | Barwicz |
| 2011/0315953 A1 | 12/2011 | Bangsaruntip et al. |
| 2012/0068150 A1 | 3/2012 | Bangsaruntip et al. |
| 2012/0187375 A1 | 7/2012 | Guo et al. |
| 2012/0292707 A1* | 11/2012 | Toh et al. ...................... 257/365 |
| 2013/0026451 A1* | 1/2013 | Bangsaruntip et al. ......... 257/24 |

* cited by examiner

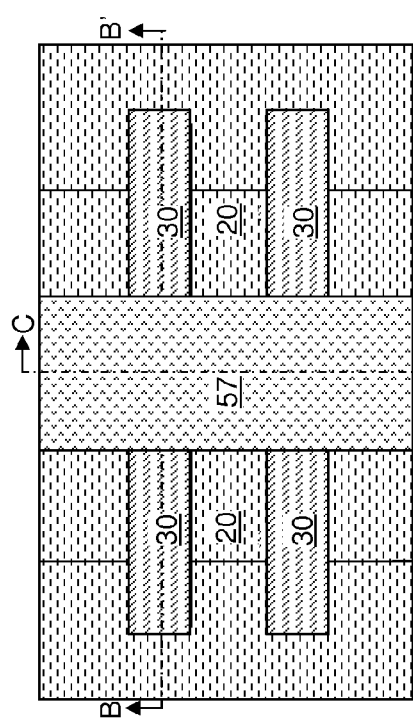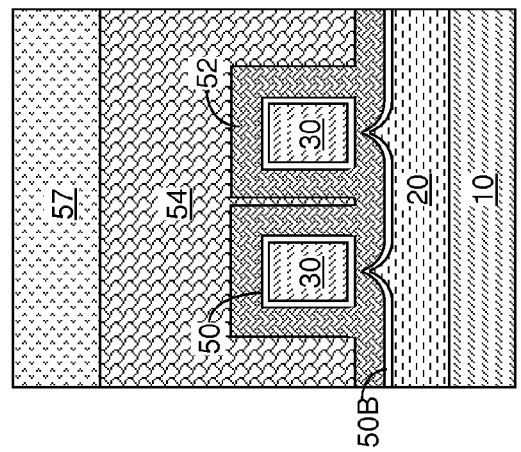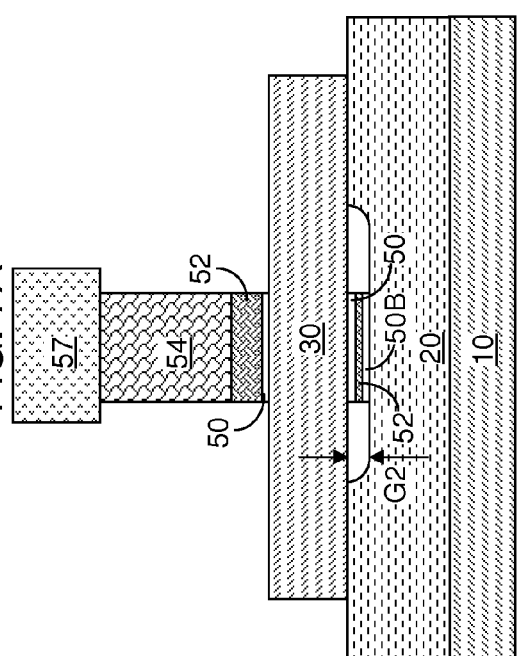
FIG. 7A
FIG. 7B
FIG. 7C

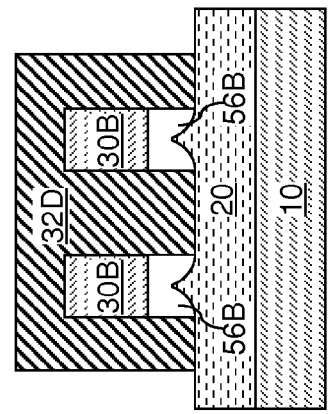
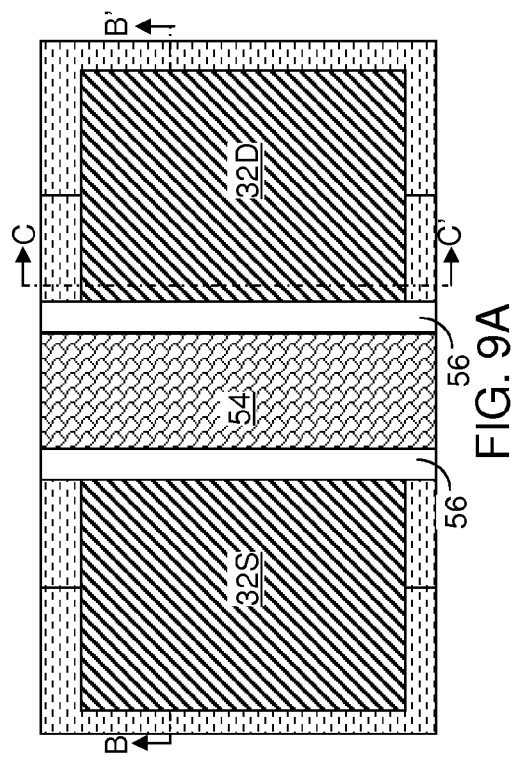
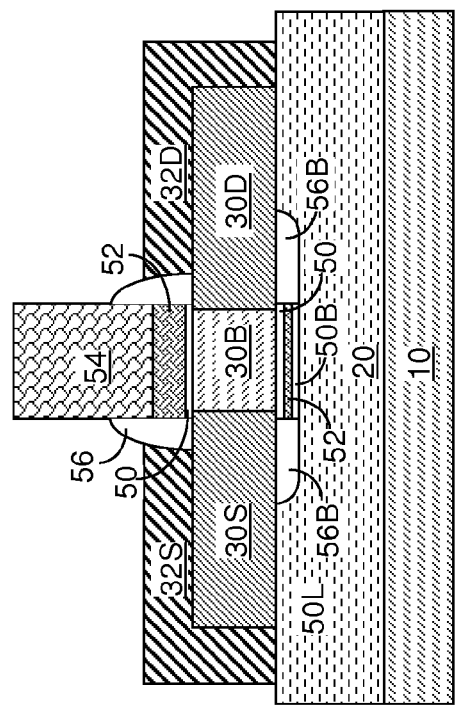

STRINGER-FREE GATE ELECTRODE FOR A SUSPENDED SEMICONDUCTOR FIN

BACKGROUND

The present disclosure relates to a semiconductor structure, and particularly to a fin field effect transistor including a metallic gate electrode layer that fills a gap between a semiconductor fin and an underlying dielectric layer, and a method of manufacturing the same.

During manufacture of a fin field effect transistor employing a suspended semiconductor fin, removal of a semiconductor material deposited as a portion of a gate conductor layer from underneath the suspended semiconductor fin can be challenging. Incomplete removal of the semiconductor material from underneath the suspended semiconductor fin can result in an undesirable capacitive coupling between a gate electrode and source/drain regions of the fin field effect transistor.

BRIEF SUMMARY

At least one semiconductor fin is formed over an insulator layer. Portions of the insulator layer are etched from underneath the at least one semiconductor fin. The amount of the etched portions of the insulator layer is selected such that a metallic gate electrode layer fills the entire gap between the recessed surfaces of the insulator layer and the bottom surface(s) of the at least one semiconductor fin. An interface between the metallic gate electrode layer and a semiconductor gate electrode layer contiguously extends over the at least one semiconductor fin and does not underlie any of the at least one semiconductor fin. During patterning of a gate electrode, removal of the semiconductor material in the semiconductor gate electrode layer can be facilitated because the semiconductor gate electrode layer is not present under the at least one semiconductor fin.

According to an aspect of the present disclosure, a method of forming a semiconductor structure is provided. A semiconductor material portion including a semiconductor fin is formed on a top surface of an insulator layer. A portion of the top surface of the insulator layer is recessed underneath the semiconductor fin. The semiconductor fin is vertically spaced from a recessed surface of the insulator layer. A gate dielectric layer is formed on the semiconductor material portion. A metallic gate electrode layer is formed on the gate dielectric layer and underneath the semiconductor fin. A semiconductor gate electrode layer is formed on the metallic gate electrode layer. An entirety of an interface between the semiconductor gate electrode layer and the metallic gate layer does not include any portion that underlies the semiconductor fin.

According to another aspect of the present disclosure, a semiconductor structure is provided. A semiconductor material portion includes a semiconductor fin and located on a contiguous top surface of an insulator layer. The contiguous top surface includes a recessed surface vertically spaced from a bottom surface of the semiconductor fin. A gate dielectric laterally surrounds a subportion of the semiconductor material portion. A gate electrode is located on the gate dielectric and including a metallic gate electrode and a semiconductor gate electrode. A portion of the metallic gate electrode is present underneath the semiconductor fin and above the recessed surface, and an entirety of an interface between the semiconductor gate electrode and the metallic gate electrode does not include any portion that underlies the semiconductor fin.

BRIEF DESCRIPTION OF SEVERAL VIEWS OF THE DRAWINGS

FIG. 7A is a top-down view of the first exemplary semiconductor structure after patterning a gate electrode according to the first embodiment of the present disclosure.

FIG. 7B is a vertical cross-sectional view of the first exemplary semiconductor structure along the vertical plane B-B' of FIG. 7A.

FIG. 7C is a vertical cross-sectional view of the first exemplary semiconductor structure along the vertical plane C-C' of FIG. 7A.

FIG. 9A is a top-down view of the first exemplary semiconductor structure after formation of raised source/drain regions according to the first embodiment of the present disclosure.

FIG. 9B is a vertical cross-sectional view of the first exemplary semiconductor structure along the vertical plane B-B' of FIG. 9A.

FIG. 9C is a vertical cross-sectional view of the first exemplary semiconductor structure along the vertical plane C-C' of FIG. 9A.

DETAILED DESCRIPTION

Figure 1A:
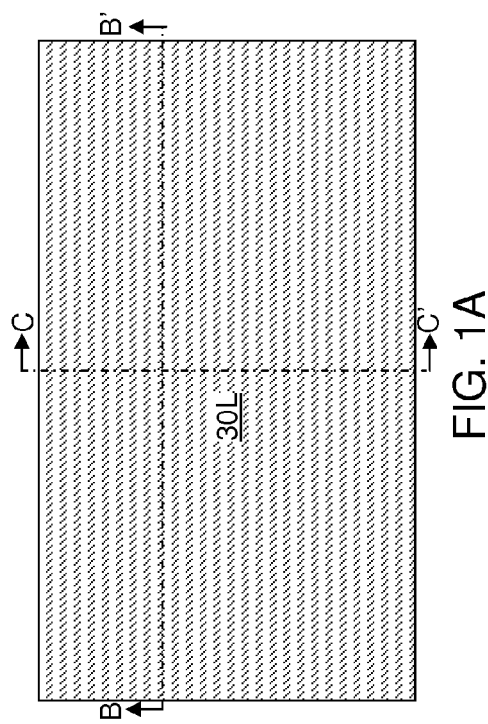
FIG. 1A is a top-down view of a first exemplary semiconductor structure including a semiconductor-on-insulator (SOI) substrate according to a first embodiment of the present disclosure.

As stated above, the present disclosure relates to a fin field effect transistor including a metallic gate electrode layer that fills a gap between a semiconductor fin and an underlying dielectric layer, and a method of manufacturing the same. Aspects of the present disclosure are now described in detail with accompanying figures. It is noted that like reference numerals refer to like elements across different embodiments. The drawings are not necessarily drawn to scale.

Figure 1B:
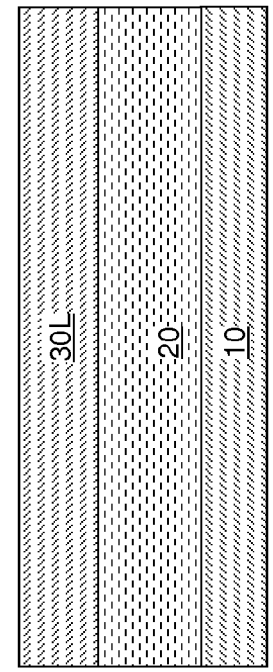
FIG. 1B is a vertical cross-sectional view of the first exemplary semiconductor structure along the vertical plane B-B' of FIG. 1A.
Figure 1C:
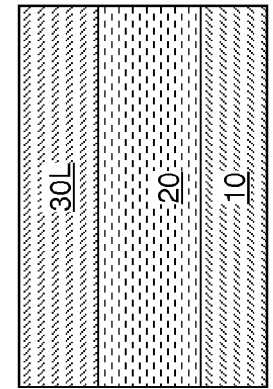
FIG. 1C is a vertical cross-sectional view of the first exemplary semiconductor structure along the vertical plane C-C' of FIG. 1A.

Referring to FIGS. 1A-1C, a first exemplary semiconductor structure according to a first embodiment of the present disclosure includes a semiconductor-on-insulator (SOI) substrate. The SOI substrate includes a handle substrate 10, an insulator layer 20, and a top semiconductor layer 30L. The insulator layer 20 is a buried insulator layer that is located between the handle substrate 10 and the top semiconductor layer 30L.

The handle substrate 10 can include a semiconductor material, an insulator material, a conductive material, or a combination thereof. The handle substrate 10 provides mechanical support to the insulator layer 20 and the top semiconductor layer 30L. The handle substrate 10 can have a thickness from 50 microns to 2 mm, although lesser and greater thicknesses can also be employed.

The insulator layer 20 includes a dielectric material such as silicon oxide, silicon nitride, silicon oxynitride, and/or a dielectric metal oxide. In one embodiment, the insulator layer 20 can be a silicon oxide layer. The thickness of the insulator layer 20 can be from 5 nm to 500 nm, although lesser and greater thicknesses can also be employed.

The top semiconductor layer 30L includes a semiconductor material, which can be a single crystalline material, a polycrystalline semiconductor material, or an amorphous semiconductor material. In one embodiment, the top semiconductor layer 30L includes a single crystalline semiconductor material such as a single crystalline elemental semiconductor material, a single crystalline semiconductor material of at least two elemental semiconductor materials, or a single crystalline compound semiconductor material. The thickness of the top semiconductor layer 30L can be from 5 nm to 500 nm, although lesser and greater thicknesses can also be employed.

Figure 2A:
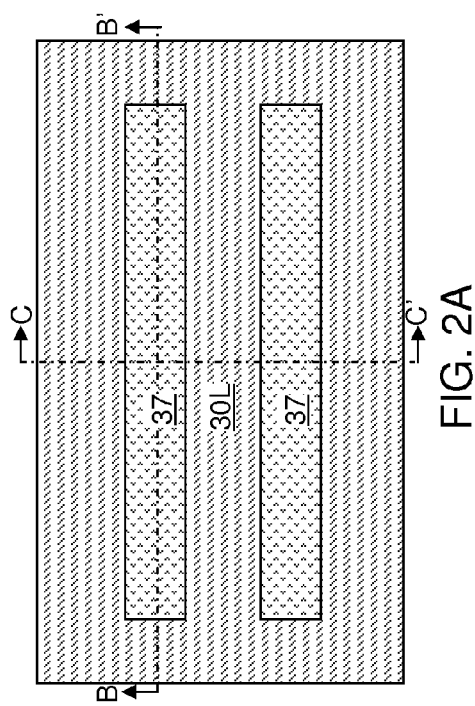
FIG. 2A is a top-down view of the first exemplary semiconductor structure after formation of semiconductor fins according to the first embodiment of the present disclosure.
Figure 2C:
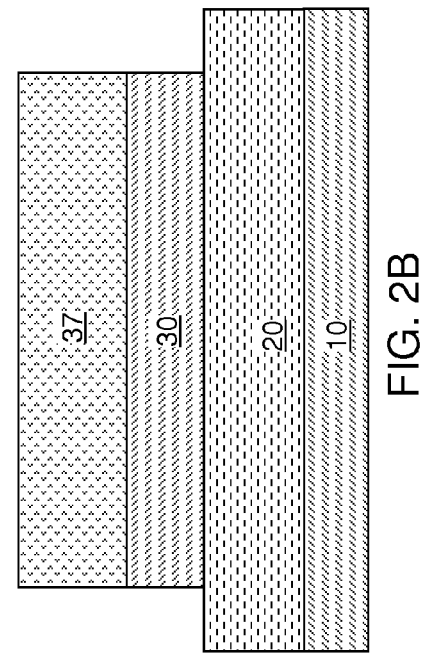
FIG. 2C is a vertical cross-sectional view of the first exemplary semiconductor structure along the vertical plane C-C' of FIG. 2A.
Figure 2B:
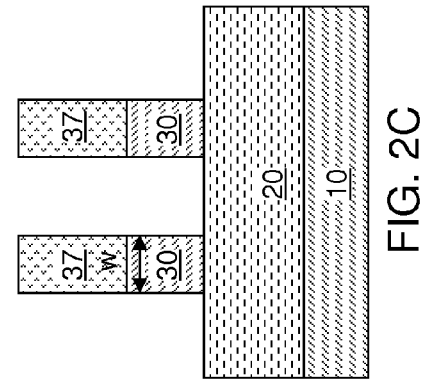
FIG. 2B is a vertical cross-sectional view of the first exemplary semiconductor structure along the vertical plane B-B' of FIG. 2A.

Referring to FIGS. 2A-2C, the top semiconductor layer 30L is patterned to form semiconductor material portions.

The semiconductor material portions can be semiconductor-fin-including structures. In one embodiment, each of the semiconductor material portions can consist of a semiconductor fin 30, and the semiconductor material portions can be a plurality of semiconductor fins 30.

For example, a photoresist layer 37 can be applied over the top surface of the top semiconductor layer 30L, and can be lithographically patterned so that remaining portions of the patterned photoresist layer 37 have rectangular horizontal cross-sectional shapes. The pattern in the photoresist layer 37 can be transferred into the top semiconductor layer 30L by an anisotropic etch, which removes physically exposed portions of the top semiconductor layer 30L.

Each semiconductor fin 30 can have a uniform width w between a pair of lengthwise sidewalls. As used herein, a width is uniform if the width is invariant under lateral translation. A "lengthwise" direction of a semiconductor fin 30 refers to a horizontal direction along which the semiconductor fin 30 has a greatest lateral extent. A "lengthwise sidewall" refers to a sidewall that extends along the lengthwise direction of a semiconductor fin 30. The uniform width of each semiconductor fin 30 can be from 5 nm to 300 nm, although lesser and greater dimensions can also be employed. The height of each semiconductor fin 30 can be from 5 nm to 500 nm, although lesser and greater heights can also be employed. In one embodiment, the entirety of each semiconductor fin 30 can be single crystalline. The photoresist layer 37 is subsequently removed, for example, by ashing.

Figure 3A:
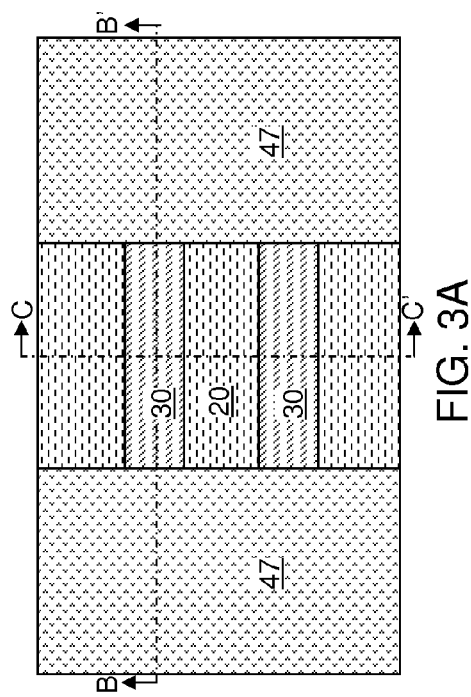
FIG. 3A is a top-down view of the first exemplary semiconductor structure after formation of a patterned photoresist layer that blocks end portions of semiconductor fins according to the first embodiment of the present disclosure.
Figure 3B:
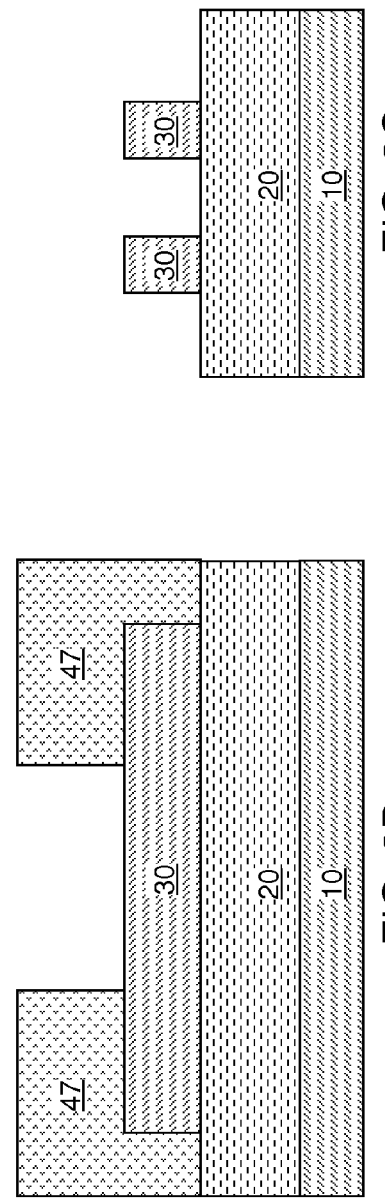
FIG. 3B is a vertical cross-sectional view of the first exemplary semiconductor structure along the vertical plane B-B' of FIG. 3A.
Figure 3C:
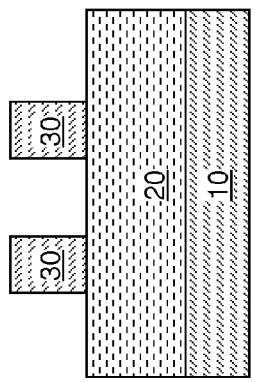
FIG. 3C is a vertical cross-sectional view of the first exemplary semiconductor structure along the vertical plane C-C' of FIG. 3A.

Referring to FIGS. 3A-3C, an etch mask layer 47 is formed over a first end portion of each semiconductor fin 30 and a second end portion of each semiconductor fin 30. The etch mask layer 47 can be a patterned photoresist layer, which can be applied as a blanket photoresist layer and subsequently patterned employing lithographic methods.

In one embodiment, sidewalls of the etch mask layer 47 that contact the plurality of semiconductor fins 30 can be perpendicular to the lengthwise direction of the plurality of semiconductor fins 30. A center portion of each semiconductor fin 30 is physically exposed after patterning of the etch mask layer 47.

Figure 4C:
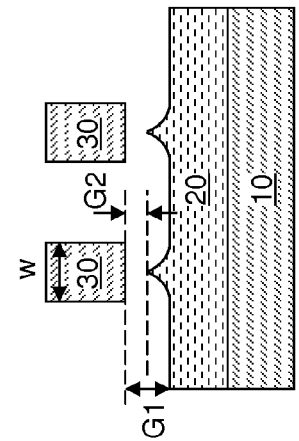
FIG. 4C is a vertical cross-sectional view of the first exemplary semiconductor structure along the vertical plane C-C' of FIG. 4A.
Figure 4A:
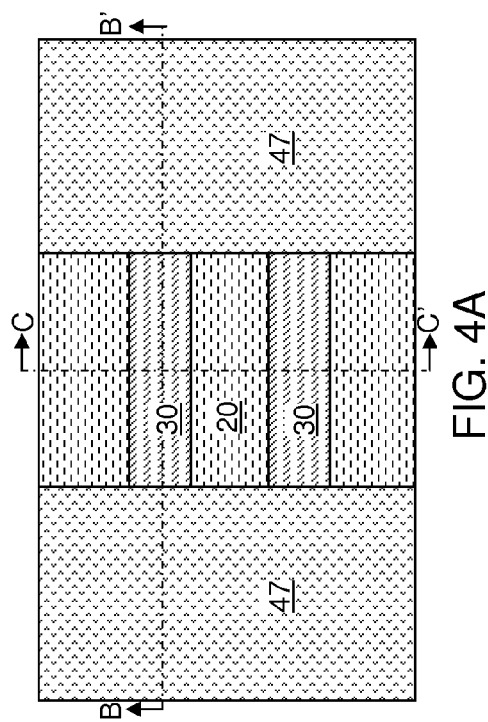
FIG. 4A is a top-down view of the first exemplary semiconductor structure after recessing physically exposed surfaces of an insulator layer according to the first embodiment of the present disclosure.
Figure 4B:
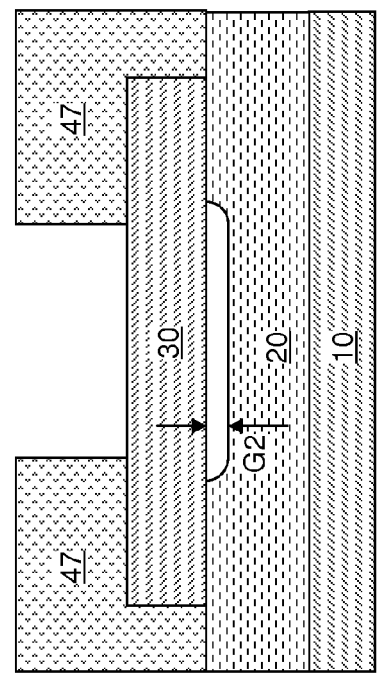
FIG. 4B is a vertical cross-sectional view of the first exemplary semiconductor structure along the vertical plane B-B' of FIG. 4A.

Referring to FIGS. 4A-4C, physically exposed surfaces of the insulator layer 20 are recessed employing the etch mask layer 47 an etch mask. The recessing of the physically exposed top surfaces of the insulator layer 20 can be performed employing an etch chemistry that is selective to the semiconductor material of the plurality of semiconductor fins 30. For example, if the plurality of semiconductor fins 30 includes silicon and the insulator layer 20 includes silicon oxide, a wet etch employing hydrofluoric acid can be employed to recess the physically exposed top surfaces of the insulator layer 47.

The etch that recesses the physically exposed top surfaces of the insulator layer 20 can be a wet etch or a dry etch. The recessing of the portions of the top surface of the insulator layer 20 underneath the semiconductor fins 30 can be performed by isotropically etching physically exposed surfaces of the insulator layer 20 employing the etch mask layer 47 as an etch mask. In one embodiment, the etch that recesses the physically exposed top surfaces of the insulator layer 20 can be an isotropic wet etch or an isotropic dry etch.

A portion of the top surface of the insulator layer 20 is recessed underneath each semiconductor fin 30. Each semiconductor fin 30 is vertically spaced from a recessed surface of the insulator layer 20. In one embodiment, the recessing of physically exposed portions of the top surface of the insulator layer 30 underneath the semiconductor fins 30 can form a ridge underneath each semiconductor fin 30. As used herein, a ridge refers to a line at which two surfaces meet. The two surfaces that meet at each ridge underlying a semiconductor fin 30 are not vertical, and are not horizontal, and are at an angle greater than 0 degrees and less than 90 degrees relative to a vertical line that is a surface normal of interfaces between the plurality of semiconductor fins 30 and remaining portions of the insulator layer 20. As used herein, a first element "underlies" a second element if the entirety of the first element is within an area of the second element as defined in a horizontal cross-sectional view, and is located underneath the first element.

Each ridge extends along the lengthwise direction of the plurality of semiconductor fins 30. For each semiconductor fin 30, the ridge that underlies the semiconductor fin 30 can be formed within a vertical plane that is located at the same lateral offset from each of two vertical planes including the pair of lengthwise sidewalls of the semiconductor fin 30. In other words, the ridge can be equidistant from the vertical planes that include lengthwise sidewalls of the overlying semiconductor fin 30.

The vertical distance between the bottom surface of a semiconductor fin 30 and an underlying ridge is herein referred to as a first gap distance G1. The vertical distance between a horizontal plane including the bottom surfaces of the semiconductor fins 30 and planar portions of the recessed portions of the top surface of the insulator layer 20 is herein referred to as a second gap distance G2. The second gap distance G2 is greater than the first gap distance G1. The duration of the etch that recesses the top surface of the insulator layer 20 is selected such that the first gap distance G1 is non-zero, and the second gap distance G2 is less than the sum of the thickness of a gate dielectric layer to be subsequently formed on a semiconductor fin 30, the thickness of any additional gate dielectric layer to be subsequently formed on the insulator layer 20, and the thickness of metallic gate electrode layer to be subsequently deposited.

The etch mask layer 47 prevents etching of the insulator layer 20 at the first and second end portions of each semiconductor layer 30. A center portion of the first end portion and a center portion of the second end portion of each semiconductor fin 30 contact unrecessed portions of the top surface of the insulator layer 20. If an isotropic etch is employed to recess physically exposed portions of the top surface of the insulator layer 20, the regions of the first and second end portions that are laterally offset from a proximal sidewall of the etch mask layer 47 by a distance greater than the second gap distance G2 contact the top surface of the insulator layer 20.

Figure 5C:
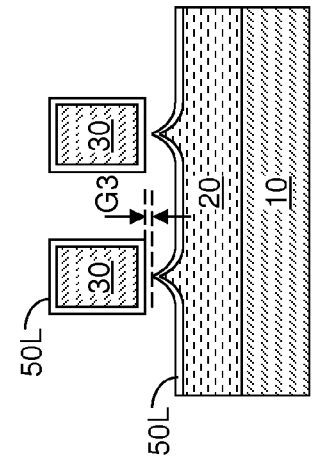
FIG. 5C is a vertical cross-sectional view of the first device region of the first exemplary semiconductor structure along the vertical plane C-C' of FIG. 5A.
Figure 5A:
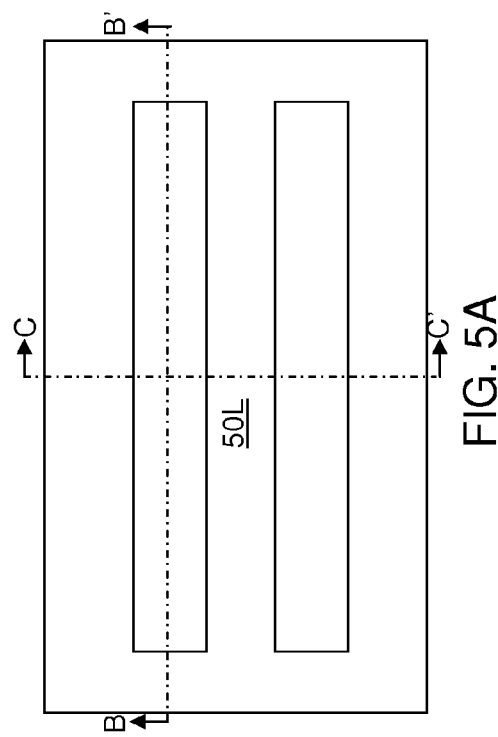
FIG. 5A is a top-down view of the first exemplary semiconductor structure after formation of a gate dielectric layer according to the first embodiment of the present disclosure.
Figure 5B:
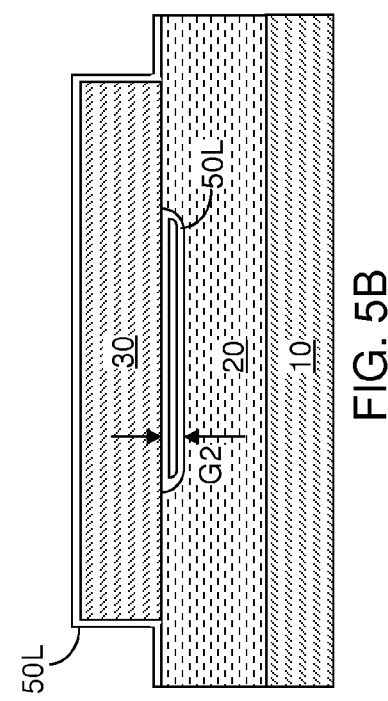
FIG. 5B is a vertical cross-sectional view of the first device region of the first exemplary semiconductor structure along the vertical plane B-B' of FIG. 5A.

Referring to FIGS. 5A-5C, a gate dielectric layer 50L is formed on surfaces of the plurality of semiconductor fins 30. The gate dielectric layer 50L can include a dielectric oxide and/or a dielectric nitride of a semiconductor material (such as silicon oxide and/or silicon nitride), and/or can include a dielectric metal oxide or a dielectric metal nitride (such as $HfO_2$, $ZrO_2$, $HfO_xN_y$, $ZrO_xN_y$) or any other high dielectric constant (high-k) gate dielectric material having a dielectric constant greater than 7.9 as known in the art. The gate dielectric layer 50L can be formed by thermal and/or plasma oxidation, thermal and/or plasma nitridation, atomic layer deposition (ALD), chemical vapor deposition (CVD), or a combination thereof. The thickness of the gate dielectric layer 50L can be from 1 nm to 6 nm, although lesser and greater thicknesses can also be employed.

In one embodiment, the gate dielectric layer 50L can include only a dielectric material derived by conversion of surface portions of the semiconductor fins 30 into a dielectric material layer, for example, by oxidation and/or nitridation.

In this case, the gate dielectric layer 50L can be formed only on semiconductor surface of the plurality of semiconductor fins 30. In another embodiment, the gate dielectric layer 50L can include a dielectric metal oxide and/or a dielectric metal nitride that are deposited, for example, by atomic layer deposition (ALD) and/or chemical vapor deposition (CVD). In this case, the gate dielectric layer 50L can be formed as a single contiguous dielectric material layer that contacts all physically exposed surfaces of the plurality of semiconductor fins 30 and the physically exposed portions of the top surface of the insulator layer 20.

A gap that is present between the bottom surface of each portion of the gate dielectric layer 50L that contacts the bottom surface of a semiconductor fin 30 and a ridge of a top surface of a portion of the gate dielectric layer 50L that underlies the semiconductor fin 40. This vertical distance of this gap is herein referred to as a third gap distance G3, which is non-zero.

Figure 6A:
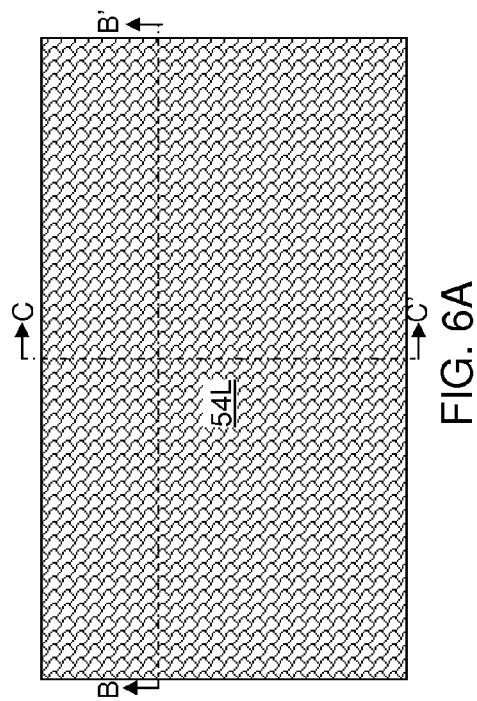
FIG. 6A is a top-down view of the first exemplary semiconductor structure after formation of a metallic gate electrode layer and a semiconductor gate electrode layer according to the first embodiment of the present disclosure.
Figure 6C:
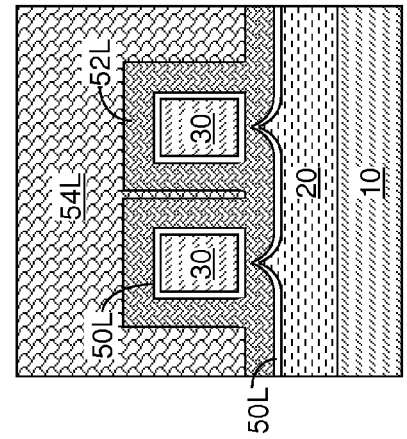
FIG. 6C is a vertical cross-sectional view of the first exemplary semiconductor structure along the vertical plane C-C' of FIG. 6A.
Figure 6B:
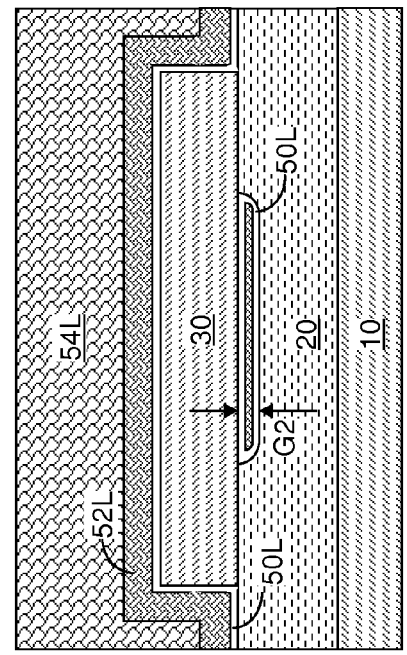
FIG. 6B is a vertical cross-sectional view of the first exemplary semiconductor structure along the vertical plane B-B' of FIG. 6A.

Referring to FIGS. 6A-6C, a metallic gate electrode layer 52L is deposited on the gate dielectric layer 50L. The metallic gate electrode layer 52L includes a metallic material, which can be an elemental metal, an intermetallic alloy, a conductive metallic compound including at least one metal element and at least one non-metal element, or a combination thereof. For example, the metallic gate electrode layer 52L can include Ti, Ta, W, TiN, TaN, WN, TiC, TaC, WC, or a combination thereof. Further, the metallic gate electrode layer 52L can include any "workfunction metal" as known in the art.

The metallic gate electrode layer 52L is deposited on the gate dielectric layer 50L and underneath each semiconductor fin 30. The thickness of the deposited metallic gate electrode layer 52L is selected such that the entirety of the space underlying each semiconductor fin 30 is completely filled with the metallic gate electrode layer 52L. Specifically, the space vertically bounded by a bottom surface of each semiconductor fin 30 and the recessed top surface of the insulator layer 20 and laterally bounded between two vertical planes including the pair of lengthwise sidewalls that contain the lengthwise sidewalls of the semiconductor fin 30 is completely filled with the metallic gate electrode layer 52L and the gate dielectric layer 50L.

A semiconductor gate electrode layer 54L is subsequently deposited on the metallic gate electrode layer, wherein an entirety of an interface between the semiconductor gate electrode layer and the metallic gate layer does not include any portion that underlies the semiconductor fin. The semiconductor gate electrode layer 54L includes a doped semiconductor material, which can be, for example, doped polysilicon, a doped silicon-germanium alloy, and/or any other doped semiconductor material. The semiconductor gate electrode layer 54L can be deposited, for example, by chemical vapor deposition (CVD).

A contiguous interface is formed between the metallic gate electrode layer 52L and the semiconductor gate electrode layer 54L. All portions of the contiguous interface that are formed below a horizontal plane including the topmost surface of the plurality of semiconductor fins 30 are laterally spaced from a most proximal semiconductor fin 30 among the plurality of semiconductor fins 30 at least by the lateral thickness of the metallic gate electrode layer 52L as measured on a lengthwise sidewall of the semiconductor fin 30. Further, all portions of the semiconductor gate electrode layer 54L formed below the horizontal plane including the topmost surface of the plurality of semiconductor fins 30 are laterally spaced from the most proximal semiconductor fin 30 among the plurality of semiconductor fins 30 at least by a lateral thickness of the metallic gate electrode layer 54L as measured on a lengthwise sidewall of the semiconductor fin 30.

Referring to FIGS. 7A-7C, a gate electrode (52, 54) is formed by patterning the semiconductor gate electrode layer 54L and the metallic gate electrode layer 52L. The gate electrode (52, 54) includes a metallic gate electrode 52 and a semiconductor gate electrode 54. The patterning of the semiconductor gate electrode layer 54L and the metallic gate electrode layer 52L can be performed by applying and patterning a photoresist layer 57 above the semiconductor gate electrode layer 54L, and transferring the pattern in the photoresist layer 57 into the stack of the semiconductor gate electrode layer 54L and the metallic gate electrode layer 52L by at least one etch.

In one embodiment, the at least one etch can be a combination of an anisotropic etch and an isotropic etch, or an anisotropic etch that provides a collateral lateral etch at a rate less than the etch rate along the vertical direction. Thus, the sidewalls of the gate electrode (52, 54) can be laterally offset from the sidewalls of the photoresist layer 57. Further, two portions of the metallic gate electrode layer 52L can be removed from underneath each semiconductor fin 30 to form cavities. The metallic gate electrode 52 laterally surrounds a center portion of each semiconductor fin 30.

Physically exposed portions of the gate dielectric layer 50L are etched, for example, by an isotropic etch such as a wet etch. Each remaining portion of the gate dielectric layer 50L that laterally surrounds a semiconductor fin 30 constitutes a gate dielectric 50. A portion of the metallic gate electrode 52 underlies each semiconductor fin 30. The gate dielectrics 50 and the gate dielectric material portions 50B can include the same dielectric material. Each remaining portion of the gate dielectric layer 50L that contacts the insulator layer 20 constitutes a gate dielectric material portion 50B. The photoresist layer 57 is subsequently removed, for example, by ashing.

Figure 8A:
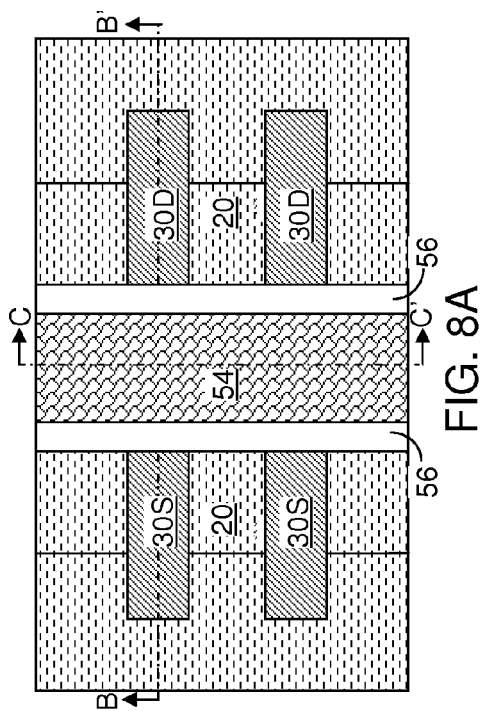
FIG. 8A is a top-down view of the first exemplary semiconductor structure after formation of a gate spacer and source/drain regions according to the first embodiment of the present disclosure.
Figure 8C:
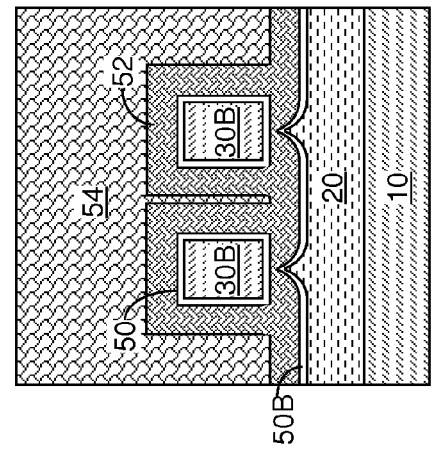
FIG. 8C is a vertical cross-sectional view of the first exemplary semiconductor structure along the vertical plane C-C' of FIG. 8A.
Figure 8B:
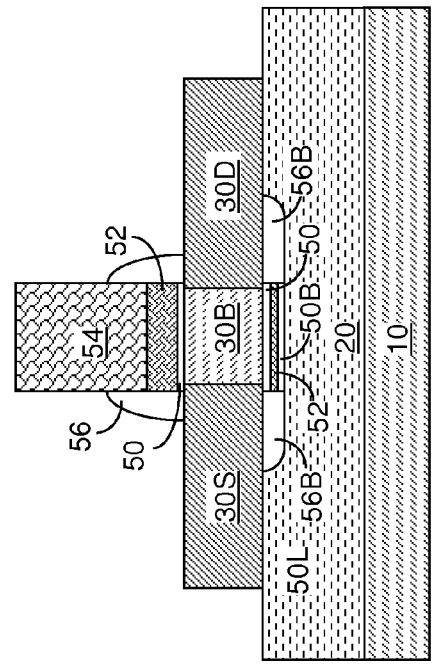
FIG. 8B is a vertical cross-sectional view of the first exemplary semiconductor structure along the vertical plane B-B' of FIG. 8A.

Referring to FIGS. 8A-8C, a gate spacer 56 and source/drain regions (30S, 30D) can be formed. The gate spacer 56 can be formed, for example, by depositing a dielectric material layer on the gate electrode (52, 54), and anisotropically etching the dielectric material layer. Remaining portions of the dielectric material layer includes a gate spacer 56 that does not underlie the semiconductor fin and two dielectric material portions 56B that fill the cavities underlying the semiconductor fins 30. The gate spacer and all dielectric material portions 56B are formed as a single contiguous structure.

As used herein, "source/drain regions" collectively refer to source regions 30S and drain regions 30D. Each source region 30S is formed in a first end portion of a semiconductor fin 30, and each drain region 30D is formed in a second end portion of a semiconductor fin 30. The source regions 30S and the drain regions 30D can be formed, for example, by implantation of electrical dopants into the first and second end portions of each semiconductor fin 30 by ion implantation. The unimplanted portion of each semiconductor fin 30 is a body region 30B.

The first exemplary semiconductor structure includes at least a semiconductor material portion including a semiconductor fin (30S, 30B, 30D) and located on a contiguous top surface of an insulator layer 20. The contiguous top surface includes a recessed surface vertically spaced from the bottom surfaces of the semiconductor fins 30. A gate dielectric 50 laterally surrounds a subportion of each semiconductor material portion, i.e., a center portion of each semiconductor fin 30 that includes a body region 30B. The gate electrode (52, 54) is located on the gate dielectric 50, and includes a metallic gate electrode 52 and a semiconductor gate electrode 54. A portion of the metallic gate electrode 53 is present underneath each semiconductor fin 30 and above the recessed surfaces of the dielectric layer 20. The entirety of the interface between the semiconductor gate electrode 52 and the metallic gate electrode 54 does not include any portion that underlies any of the semiconductor fins 30.

Each semiconductor fin 30 extends along the lengthwise direction and includes a pair of lengthwise sidewalls that are parallel to each other. For each semiconductor fin 30, the entirety of the space vertically bounded by the bottom surface of the semiconductor fin 30 and the recessed surface of the insulator layer 20 and laterally bounded between two vertical planes including the pair of lengthwise sidewalls of the semiconductor fin 30 is completely filled with the metallic gate electrode 54, a gate dielectric 50, and optionally a gate dielectric material portion 50B.

A ridge is located at the recessed surface underneath each semiconductor fin 30. Each ridge extends along the lengthwise direction. For each semiconductor fin (30S, 30B, 30D), the underlying ridge is within a vertical plane that is located at a same lateral offset from each of two vertical planes including the pair of lengthwise sidewalls of the semiconductor fin (30S, 30B, 30D). A contiguous interface is present between the metallic gate electrode 52 and the semiconductor gate electrode 54. All portions of the contiguous interface that are present underneath a topmost surface of the plurality of semiconductor fins 30 are laterally spaced from a most proximate semiconductor fin 30 at least by a lateral thickness of the metallic gate electrode 52 as measured on one of the lengthwise sidewalls of the semiconductor fins 30. All portions of the semiconductor gate electrode 54 that are present below the horizontal plane including the topmost surface of the semiconductor fin 30 are laterally spaced from the most proximate semiconductor fin 30 at least by the lateral thickness of the metallic gate electrode 52 as measured on one of the lengthwise sidewalls of the semiconductor fins 30.

The gate spacer 56 laterally surrounds the gate electrode (52, 54). For each semiconductor fin (30S, 30B, 30D), two dielectric material portions 56B underlie the semiconductor fin (30S, 30B, 30D) and overlie the recessed surface of the insulator layer 20. The gate spacer 56 and the two dielectric material portions 56B can include the same dielectric material. Further, the gate spacer 56 and all of the dielectric material portions 56B constitute a single contiguous structure. Each portion of the metallic gate electrode 52 underlying a semiconductor fin (30S, 30B, 30D) contacts surfaces of the two dielectric material portions 50B underlying the semiconductor fin (30S, 30B, 30D).

Each semiconductor fin (30S, 30B, 30D) includes a body region 30B located in the semiconductor fin (30S, 30B, 30D) and laterally surrounded by the gate dielectric 50, and a source region 30S and a drain region 30D that laterally contact the body region 30B at two laterally spaced interfaces within the semiconductor fin (30S, 30B, 30D).

Each semiconductor material portion on the insulator layer 20 can consist of a semiconductor fin (30S, 30B, 30D). Two end portions of each semiconductor fin (30S, 30B, 30D) among the plurality of semiconductor fins (30S, 30B, 30D) can be in contact with planar portions of the contiguous top surface of the insulator layer 20. The recessed surface of the insulator layer 20 is vertically recessed relative to the planar portions of the contiguous top surface.

Referring to FIGS. 9A-9C, raised source/drain regions (32S, 32D) can be optionally formed on the source/drain regions (30S, 30D). Specifically, a raised source region 32S can be formed on the plurality of source regions 30S, and a raised drain region 32D can be formed on the plurality of drain regions 30D. The formation of the raised source region 32S and the raised drain region 32D can be performed simultaneously by selective epitaxy. In this case, the raised source region 32S and the raised drain region 32D can have a doped single crystalline material having the same type of doping as the source regions 30S and the drain regions 30D.

The raised source/drain regions (32S, 32D) provide a merged source structure (30S, 23S) and a merged drain structure (30D, 32D) that function as a single source node and a single drain node, respective, of the plurality of body regions 30B of a field effect transistor. Sidewalls of each of the dielectric material portions 56B can be vertically coincident with lengthwise sidewalls of the overlying semiconductor fin (30S, 30B, 30D). Specifically, sidewalls of each of the dielectric material portions 56B can be vertically coincident with lengthwise sidewalls of an overlying source region 30S or with lengthwise sidewalls of an overlying drain region 30D. As used herein a first sidewall and a second sidewall are "vertically coincident" if the first sidewall and the second sidewall are within a same vertical plane. Subsequently, a contact level dielectric material layer (not shown) and various contact via structures can be formed as known in the art.

Figure 10A:
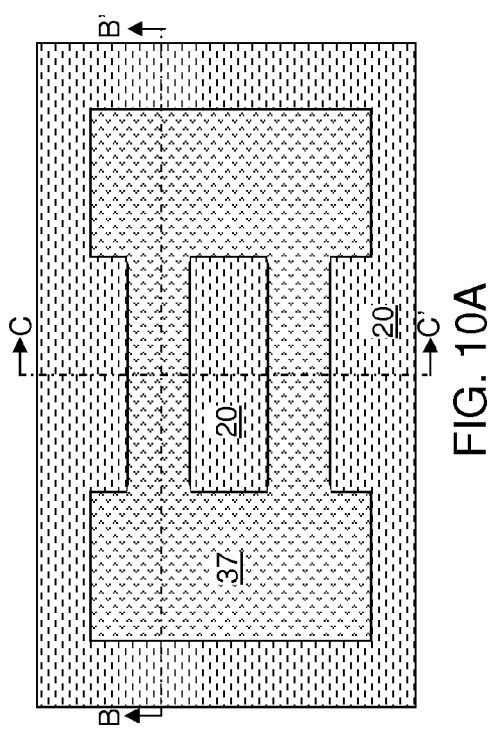
FIG. 10A is a top-down view of a second exemplary semiconductor structure including a fin-containing semiconductor portion according to a second embodiment of the present disclosure.
Figure 10B:
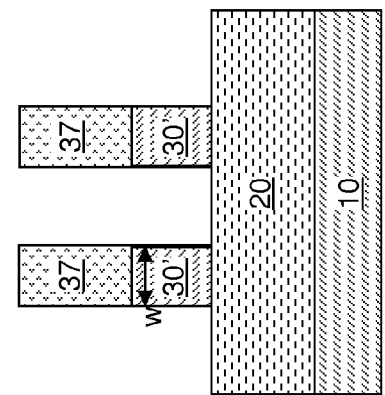
FIG. 10B is a vertical cross-sectional view of the second exemplary semiconductor structure along the vertical plane B-B' of FIG. 10A.
Figure 10C:
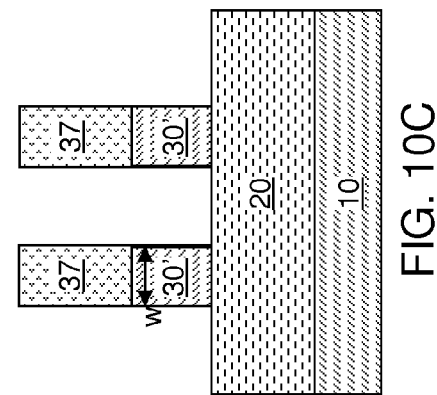
FIG. 10C is a vertical cross-sectional view of the second exemplary semiconductor structure along the vertical plane C-C' of FIG. 10A.

Referring to FIGS. 10A-10C, a second exemplary semiconductor structure according to a second embodiment of the present disclosure is derived from the first exemplary semiconductor structure of FIGS. 1A-1C by forming a fin-containing semiconductor portion 30'. The processing steps of FIGS. 2A-2C can be employed with the modification of the pattern formed in the photoresist layer 37. The fin-containing semiconductor portion 30' is a remaining portion of the top semiconductor layer 30L after transferring the pattern in the photoresist layer 30 into the top semiconductor layer 30L, for example, by an anisotropic etch.

The pattern in the photoresist layer 37 can be modified such that the fin-containing semiconductor portion 30' includes a plurality of semiconductor fins having the same shapes as in the first embodiment, a first semiconductor pad adjoined to a first end of each of the plurality of semiconductor fins, and a second semiconductor pad adjoined to a second end of each of the plurality of semiconductor fins.

Figure 11A:
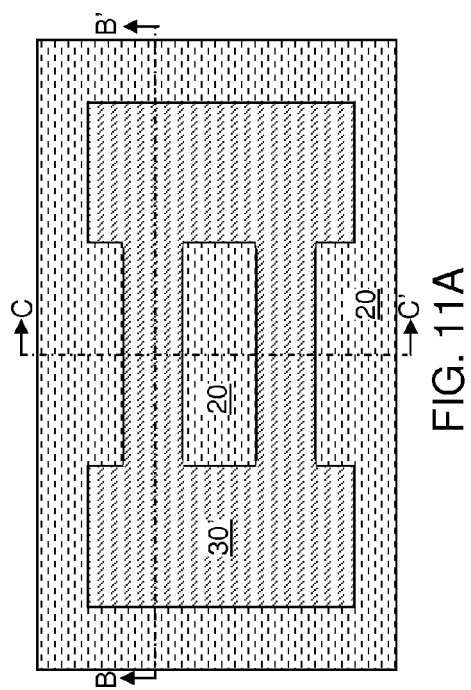
FIG. 11A is a top-down view of the second exemplary semiconductor structure after recessing physically exposed surfaces of an insulator layer according to the second embodiment of the present disclosure.
Figure 11C:
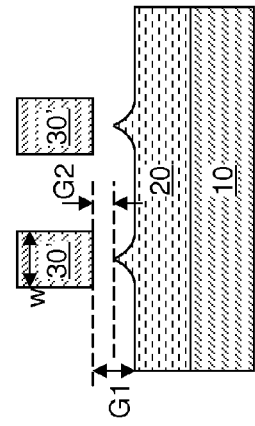
FIG. 11C is a vertical cross-sectional view of the second exemplary semiconductor structure along the vertical plane C-C' of FIG. 11A.
Figure 11B:
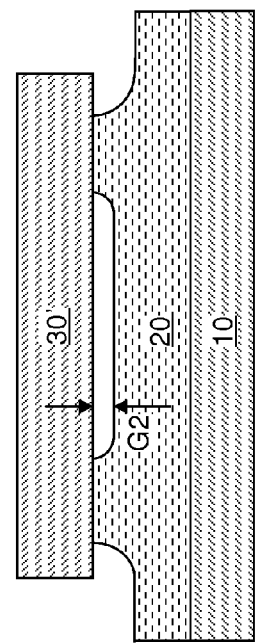
FIG. 11B is a vertical cross-sectional view of the second exemplary semiconductor structure along the vertical plane B-B' of FIG. 11A.

Referring to FIGS. 11A-11C, the processing steps of FIGS. 4A-4C are performed employing the fin-containing semiconductor portion 30' as an etch mask. A portion of the top surface of the insulator layer 20 is recessed underneath each semiconductor fin. Each semiconductor fin becomes suspended by the recess etch, i.e., each semiconductor fin becomes vertically spaced from the recessed surface of the insulator layer 20. The same etch chemistry can be employed as in the processing steps of FIGS. 4A-4C. Peripheral portions of each of the first and second semiconductor pads are undercut. A center portion of each of the first and second semiconductor pads contacts an unrecessed portion of the top surface of the insulator layer 20.

Figure 12A:
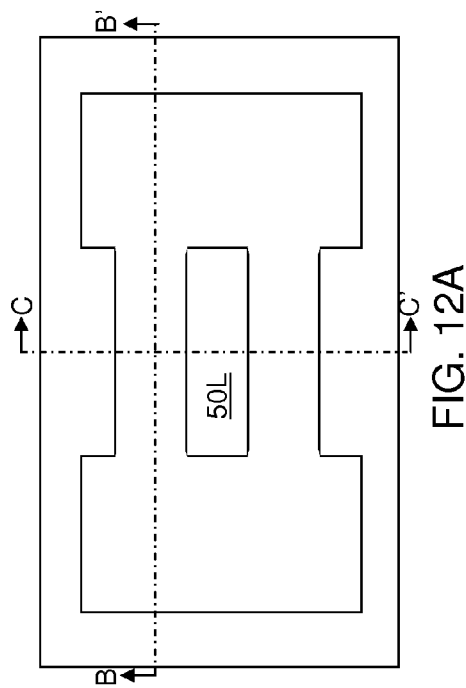
FIG. 12A is a top-down view of the second exemplary semiconductor structure after formation of a gate dielectric layer according to the second embodiment of the present disclosure.
Figure 12C:
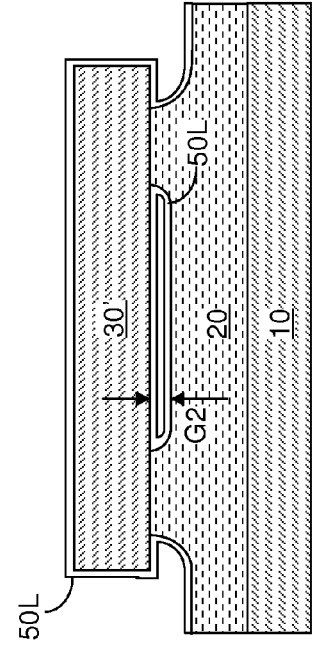
FIG. 12C is a vertical cross-sectional view of the second exemplary semiconductor structure along the vertical plane C-C' of FIG. 12A.
Figure 12B:
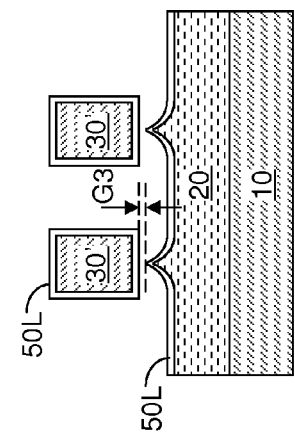
FIG. 12B is a vertical cross-sectional view of the second exemplary semiconductor structure along the vertical plane B-B' of FIG. 12A.

Referring to FIGS. 12A-12C, the processing steps of FIGS. 5A-5C are performed to form a gate dielectric layer 50L.

Figure 13A:
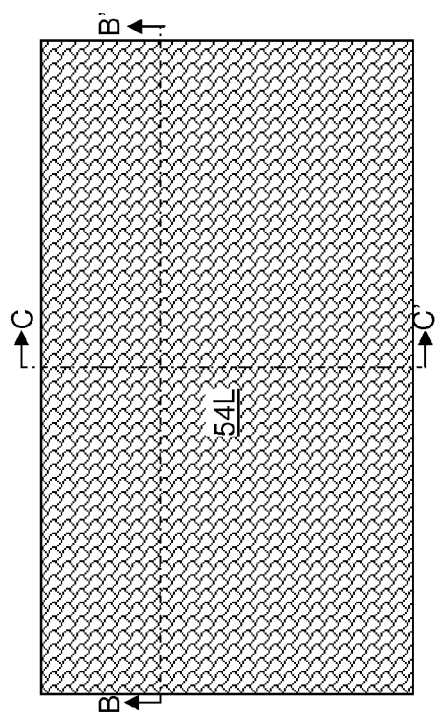
FIG. 13A is a top-down view of the second exemplary semiconductor structure after formation of a metallic gate electrode layer and a semiconductor gate electrode layer according to the second embodiment of the present disclosure.
Figure 13C:
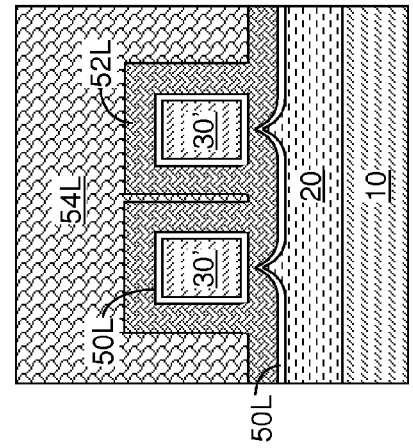
FIG. 13C is a vertical cross-sectional view of the second exemplary semiconductor structure along the vertical plane C-C' of FIG. 13A.
Figure 13B:
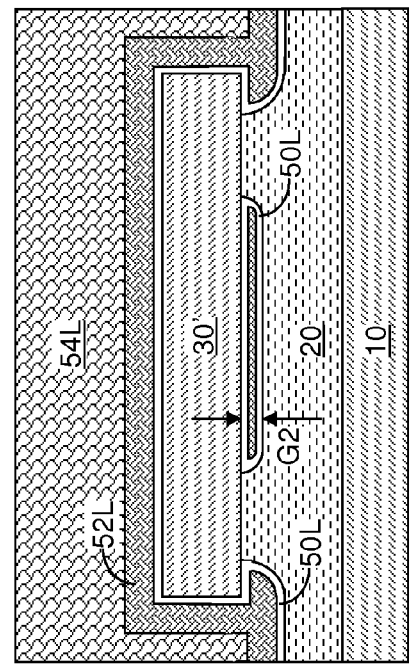
FIG. 13B is a vertical cross-sectional view of the second exemplary semiconductor structure along the vertical plane B-B' of FIG. 13A.

Referring to FIGS. 13A-13C, the processing steps of FIGS. 6A-6C are performed to form a metallic gate electrode layer 52L and a semiconductor gate electrode layer 54L. Specifically, the metallic gate electrode layer 52L is deposited on the gate dielectric layer 50L. The metallic gate electrode layer 52L can have the same composition as, and can be formed by the same method as, in the first embodiment.

The metallic gate electrode layer 52L is deposited on the gate dielectric layer 50L and underneath each semiconductor fin. The thickness of the deposited metallic gate electrode layer 52L is selected such that the entirety of the space underlying each semiconductor fin is completely filled with the metallic gate electrode layer 52L. Specifically, the space vertically bounded by a bottom surface of each semiconductor fin and the recessed top surface of the insulator layer and laterally bounded between two vertical planes including the pair of lengthwise sidewalls that contain the lengthwise sidewalls of the semiconductor fin is completely filled with the metallic gate electrode layer 52L and the gate dielectric layer 50L.

The semiconductor gate electrode layer 54L is subsequently deposited on the metallic gate electrode layer, wherein an entirety of an interface between the semiconductor gate electrode layer and the metallic gate layer does not include any portion that underlies the semiconductor fin. The semiconductor gate electrode layer 54L can have the same composition as, and can be formed by the same method as, in the first embodiment.

A contiguous interface is formed between the metallic gate electrode layer 52L and the semiconductor gate electrode layer 54L. All portions of the contiguous interface that are formed below a horizontal plane including the topmost surface of the plurality of semiconductor fins are laterally spaced from a most proximal semiconductor fin among the plurality of semiconductor fins at least by the lateral thickness of the metallic gate electrode layer 52L as measured on a lengthwise sidewall of the semiconductor fin. Further, all portions of the semiconductor gate electrode layer 54L formed below the horizontal plane including the topmost surface of the plurality of semiconductor fins are laterally spaced from the most proximal semiconductor fin among the plurality of semiconductor fins at least by a lateral thickness of the metallic gate electrode layer 54L as measured on a lengthwise sidewall of the semiconductor fin.

Figure 14A:
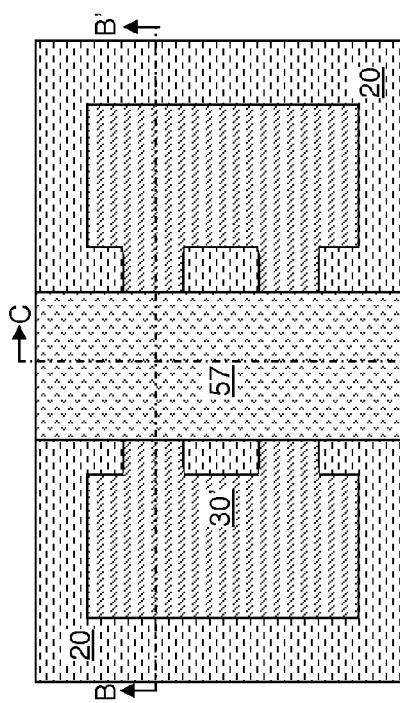
FIG. 14A is a top-down view of the second exemplary semiconductor structure after formation of a gate electrode according to the second embodiment of the present disclosure.
Figure 14C:
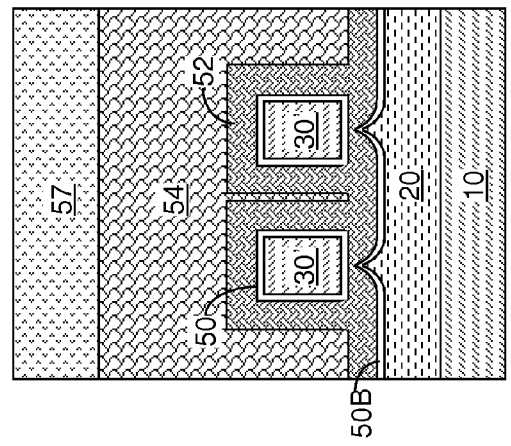
FIG. 14C is a vertical cross-sectional view of the second exemplary semiconductor structure along the vertical plane C-C' of FIG. 14A.
Figure 14B:
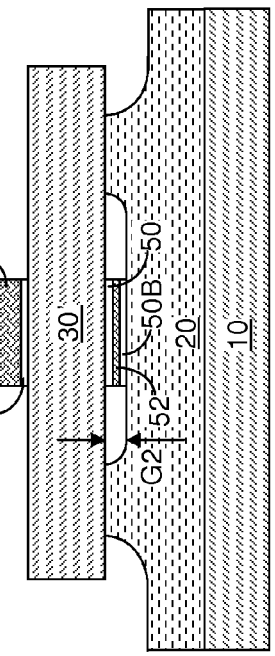
FIG. 14B is a vertical cross-sectional view of the second exemplary semiconductor structure along the vertical plane B-B' of FIG. 14A.

Referring to FIGS. 14A-14C, the processing steps of FIGS. 7A-7C of the first embodiment are performed. A gate electrode (52, 54) is formed by patterning the semiconductor gate electrode layer 54L and the metallic gate electrode layer 52L in the same manner as in the first embodiment. The gate electrode (52, 54) includes a metallic gate electrode 52 and a semiconductor gate electrode 54.

Two portions of the metallic gate electrode layer 52L can be removed from underneath each semiconductor fin to form cavities. The metallic gate electrode 52 laterally surrounds a center portion of each semiconductor fin.

Physically exposed portions of the gate dielectric layer 50L are etched, for example, by an isotropic etch such as a wet etch. Each remaining portion of the gate dielectric layer 50L that laterally surrounds a semiconductor fin constitutes a gate dielectric 50. A portion of the metallic gate electrode 52 underlies each semiconductor fin. The gate dielectrics 50 and the gate dielectric material portions 50B can include the same dielectric material. Each remaining portion of the gate dielectric layer 50L that contacts the insulator layer 20 constitutes a gate dielectric material portion 50B. The photoresist layer 57 is subsequently removed, for example, by ashing.

Figure 15A:
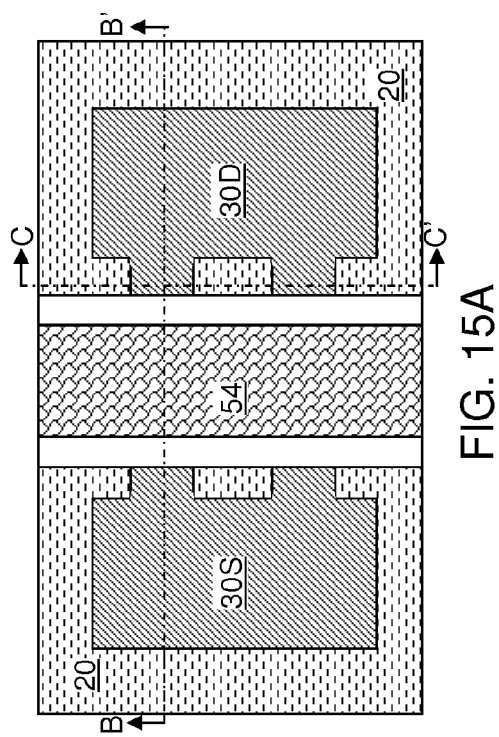
FIG. 15A is a top-down view of the second exemplary semiconductor structure after formation of a gate spacer and source/drain regions according to the second embodiment of the present disclosure.
Figure 15C:
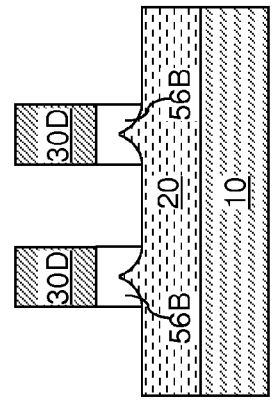
FIG. 15C is a vertical cross-sectional view of the second exemplary semiconductor structure along the vertical plane C-C' of FIG. 15A.
Figure 15B:
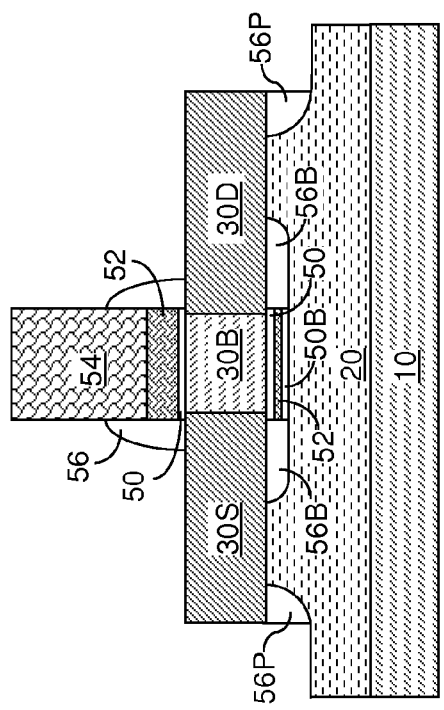
FIG. 15B is a vertical cross-sectional view of the second exemplary semiconductor structure along the vertical plane B-B' of FIG. 15A.

Referring to FIGS. 15A-15C, the processing steps of FIGS. 8A-8C of the first embodiments are performed. A gate spacer 50, source/drain regions (30S, 30D), and dielectric material portions 50B are formed in the same manner as in the first embodiment. A vertical cross-sectional view of the second exemplary structure along a vertical plane that is parallel to plane C-C' of FIG. 15A and through the gate electrode (52, 54) is the same as the vertical cross-sectional view of FIG. 8C.

The second exemplary semiconductor structure includes a semiconductor material portion, which is a fin-containing semiconductor portion (30S, 30B, 30D) and located on a contiguous top surface of an insulator layer 20. The contiguous top surface includes a recessed surface vertically spaced from the bottom surfaces of the semiconductor fins within the fin-containing semiconductor portion (30S, 30B, 30D). A gate dielectric 50 laterally surrounds a subportion of each semiconductor material portion, i.e., a center portion of each semiconductor fin that includes a body region 30B. The gate electrode (52, 54) is located on the gate dielectric 50, and includes a metallic gate electrode 52 and a semiconductor gate electrode 54. A portion of the metallic gate electrode 53 is present underneath each semiconductor fin and above the recessed surfaces of the dielectric layer 20. The entirety of the interface between the semiconductor gate electrode 52 and the metallic gate electrode 54 does not include any portion that underlies any of the semiconductor fins.

Each semiconductor fin extends along the lengthwise direction and includes a pair of lengthwise sidewalls that are parallel to each other. For each semiconductor fin, the entirety of the space vertically bounded by the bottom surface of the semiconductor fin and the recessed surface of the insulator layer 20 and laterally bounded between two vertical planes including the pair of lengthwise sidewalls of the semiconductor fin is completely filled with the metallic gate electrode 54, a gate dielectric 50, and optionally a gate dielectric material portion 50B, if present.

A ridge is located at the recessed surface underneath each semiconductor fin. Each ridge extends along the lengthwise direction. For each semiconductor fin in the fin-containing semiconductor portion (30S, 30B, 30D), the underlying ridge is within a vertical plane that is located at a same lateral offset from each of two vertical planes including the pair of lengthwise sidewalls of the semiconductor fin. A contiguous interface is present between the metallic gate electrode 52 and the semiconductor gate electrode 54. All portions of the contiguous interface that are present underneath a topmost surface of the plurality of semiconductor fins are laterally spaced from a most proximate semiconductor fin at least by a lateral thickness of the metallic gate electrode 52 as measured on one of the lengthwise sidewalls of the semiconductor fins. All portions of the semiconductor gate electrode 54 that are present below the horizontal plane including the topmost surface of the semiconductor fin are laterally spaced from the most proximate semiconductor fin at least by the lateral thickness of the metallic gate electrode 52 as measured on one of the lengthwise sidewalls of the semiconductor fins.

The gate spacer 56 laterally surrounds the gate electrode (52, 54). For each semiconductor fin, two dielectric material portions 56B underlie the semiconductor fin within the fin-containing semiconductor portion (30S, 30B, 30D), and overlie the recessed surface of the insulator layer 20. The gate spacer 56 and the two dielectric material portions 56B can include the same dielectric material. Further, the gate spacer 56 and all of the dielectric material portions 56B constitute a single contiguous structure. Each portion of the metallic gate electrode 52 underlying a semiconductor fin contacts surfaces of the two dielectric material portions 50B underlying the semiconductor fin.

Each semiconductor fin includes a body region 30B, which is laterally surrounded by the gate dielectric 50. Each semiconductor fin includes a portion of the source region 30S and the drain region 30D. For each body region 30B, each of which laterally contacts the body region 30B at two laterally spaced interfaces within the semiconductor fin that includes the body region 30B.

The fin-containing semiconductor portion (30S, 30B, 30D) includes a plurality of body regions 30B located in each of the semiconductor fins and laterally surrounded by the gate dielectric 50. Further, the fin-containing semiconductor portion (30S, 30B, 30D) includes a source region 30S and a drain region 30D, each of which laterally contacts the body regions 30B at interfaces within the semiconductor fins. The fin-containing semiconductor portion (30S, 30B, 30D) includes the first semiconductor pad that is adjoined to the first end of each of the plurality of semiconductor fins, and a second semiconductor pad that is adjoined to a second end of each of the plurality of semiconductor fins. In one embodiment, each of the first and second semiconductor pads can have a rectangular horizontal cross-sectional shape. A center portion of each bottom surface of the first and second semiconductor pads contacts the contiguous top surface of the insulator layer 20. A peripheral portion of each bottom surface of the first and second semiconductor pads does not contact the contiguous top surface of the insulator layer 20. Sidewalls of each of the dielectric material portions 56B can be vertically coincident with lengthwise sidewalls of the overlying semiconductor fin.

Subsequently, the processing steps of FIGS. 9A-9C can be performed. A contact level dielectric material layer (not shown) and various contact via structures can be formed as known in the art.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a semiconductor material portion including a semiconductor fin on a top surface of an insulator layer;
    recessing a portion of said top surface of said insulator layer underneath said semiconductor fin, wherein said semiconductor fin is vertically spaced from a recessed surface of said insulator layer; and
    providing a first material stack located above a central portion of said semiconductor fin and comprising, from bottom to top, a first gate dielectric material portion, a first metallic gate electrode and a semiconductor gate electrode, and a second material stack located beneath said central portion of said semiconductor fin and comprising from bottom to top, a lower gate dielectric material portion, a second metallic gate electrode, and an upper gate dielectric material portion, wherein said first material stack and said second material stack have sidewall edges that are vertically coincident to each other.

2. The method of claim 1, wherein said semiconductor fin extends along a lengthwise direction and includes a pair of lengthwise sidewalls that are parallel to each other.

3. The method of claim 2, wherein said recessing of said portion of said top surface of said insulator layer underneath said semiconductor fin forms a ridge underlying said semiconductor fin.

4. The method of claim 3, wherein said ridge extends along said lengthwise direction.

5. The method of claim 3, wherein said ridge is formed within a vertical plane that is located at a same lateral offset from each of two vertical planes including said pair of lengthwise sidewalls.

6. The method of claim 1, wherein cavities are present laterally adjacent said second material stack.

7. The method of claim 1, further comprising forming a source region and a drain region in said semiconductor fin by introducing dopants into end portions of said semiconductor fin after said providing said first and second material stacks.

8. The method of claim 7, further comprising forming a raised source region on said source region and a raised drain region on said drain region.

9. The method of claim 8, wherein said forming said raised source region and said raised drain region comprises a selective epitaxy process.

10. The method of claim 1, wherein said semiconductor material portion comprises a plurality of semiconductor fins including said semiconductor fin.

11. The method of claim 1, wherein said upper gate dielectric material portion is in direct physical contact with a bottommost surface of said semiconductor fin, and said bottom gate dielectric material portion is in directly physical contact with a portion of said recessed surface of said insulator layer.

12. The method of claim 1, wherein said providing said first and second material stacks comprises:
    forming a gate dielectric layer on a topmost surface and a bottom surface of said semiconductor fin and said recessed surface of said insulator layer;
    depositing a metallic gate electrode layer on said gate dielectric layer located above and beneath said semiconductor fin;
    depositing a semiconductor gate electrode layer on said metallic gate electrode layer, wherein an entirety of an interface between said semiconductor gate electrode layer and said metallic gate electric layer does not include any portion that underlies said semiconductor fin;
    patterning the semiconductor gate electrode layer and said metallic gate electrode layer to provide said semiconductor gate electrode and said first and second metallic gate electrodes; and
    removing physically exposed portions of said gate dielectric layer to provide said first gate dielectric material portion and said upper and lower gate dielectrics material portions.

13. The method of claim 12, wherein an entirety of a space vertically bounded by a bottom surface of said semiconductor fin and said recessed surface and laterally bounded between two vertical planes including said pair of lengthwise sidewalls is completely filled with said metallic gate electrode layer and said gate dielectric layer.

14. The method of claim 12, wherein all portions of said interface that are formed below a horizontal plane including a topmost surface of said semiconductor fin are laterally spaced from said semiconductor fin at least by a lateral thickness of said metallic gate electrode layer as measured on a lengthwise sidewall of said semiconductor fin.

15. The method of claim 12, wherein all portions of said semiconductor gate electrode layer formed below a horizontal plane including a topmost surface of said semiconductor fin are laterally spaced from said semiconductor fin at least by a lateral thickness of said metallic gate electrode layer as measured on a lengthwise sidewall of said semiconductor fin.

16. The method of claim 1, further comprising forming a gate spacer laterally surrounding a lower portion of said first material stack.

* * * * *